(12) United States Patent
Chou

(10) Patent No.: US 12,641,902 B2
(45) Date of Patent: May 26, 2026

(54) IMAGING DEVICE AND FINGERPRINT-RECOGNITION DEVICE

(71) Applicant: Rayprus Technology (Foshan) Co., Ltd., Foshan (CN)

(72) Inventor: Yuan-Hsu Chou, NewTaipei (TW)

(73) Assignee: Rayprus Technology (Foshan) Co., Ltd., Foshan (CN)

( * ) Notice: Subject to any disclaimer, the term of this patent is extended or adjusted under 35 U.S.C. 154(b) by 421 days.

(21) Appl. No.: 18/383,103

(22) Filed: Oct. 24, 2023

(65) Prior Publication Data

US 2024/0363659 A1      Oct. 31, 2024

(30) Foreign Application Priority Data

Apr. 27, 2023     (CN) .......................... 202310477531.9

(51) Int. Cl.
*H10F 39/00*          (2025.01)
*G06V 40/13*          (2022.01)
(52) U.S. Cl.
CPC ..... *H10F 39/8063* (2025.01); *G06V 40/1318* (2022.01); *H10F 39/804* (2025.01); *H10F 39/8053* (2025.01); *H10F 39/8057* (2025.01)
(58) Field of Classification Search
CPC .......................... H10F 39/8063; G06V 40/1318
See application file for complete search history.

(56) References Cited

U.S. PATENT DOCUMENTS

| 2021/0028215 A1* | 1/2021 | Devlin | ............... | G02B 27/0944 |
| 2021/0133420 A1* | 5/2021 | Xu | ....................... | H10F 39/8053 |
| 2022/0036029 A1* | 2/2022 | Tang | ...................... | H10F 39/805 |
| 2022/0155504 A1* | 5/2022 | Hsieh | ..................... | G02B 1/002 |
| 2024/0088185 A1* | 3/2024 | Wolk | ................ | G06V 40/1318 |

FOREIGN PATENT DOCUMENTS

| CN | 215010478 U | 12/2021 |
| CN | 114025062 A | 2/2022 |
| CN | 114217428 A | 3/2022 |
| CN | 216593224 U | 5/2022 |

* cited by examiner

*Primary Examiner* — Benjamin P Sandvik
(74) *Attorney, Agent, or Firm* — ScienBiziP, P.C.

(57)          ABSTRACT

An imaging device of reduced size includes a housing, a sensor, a filter, and a metalens. The housing defines a receiving cavity and a through hole connected to the receiving cavity. The sensor, the filter, and the metalens are disposed in the receiving cavity. The sensor is used to receive far-infrared light of the incoming light and form an image according to the far-infrared light. The filter is used to allow the far-infrared light of the incoming light to pass through. The metalens includes a substrate and a metasurface structure. The substrate is between the through hole and the filter. The metasurface structure is connected to the substrate. The far-infrared light is used to refract the far-infrared light, thereby causing the far-infrared light to focus on the sensor after passing through the filter.

20 Claims, 5 Drawing Sheets

100

421

41

X

421

41

X

IMAGING DEVICE AND FINGERPRINT-RECOGNITION DEVICE

FIELD

The subject matter relates to optical technologies, and more particularly, to an imaging device and a fingerprint-recognition device having the imaging device.

BACKGROUND

Infrared imaging technology can obtain infrared light information of a target object and convert the information into an image visible to the human eye. In an infrared imaging device, an optical module is usually used to focus the infrared light from the target object onto the sensor. However, the existing optical module requires multiple optical lenses to focus or diverge the infrared light, resulting in a complex structure of the infrared imaging devices. Therefore, there is room for improvement in the art.

BRIEF DESCRIPTION OF THE DRAWINGS

Implementations of the present technology will now be described, by way of embodiment, with reference to the attached figures.

DETAILED DESCRIPTION

Figure 1:
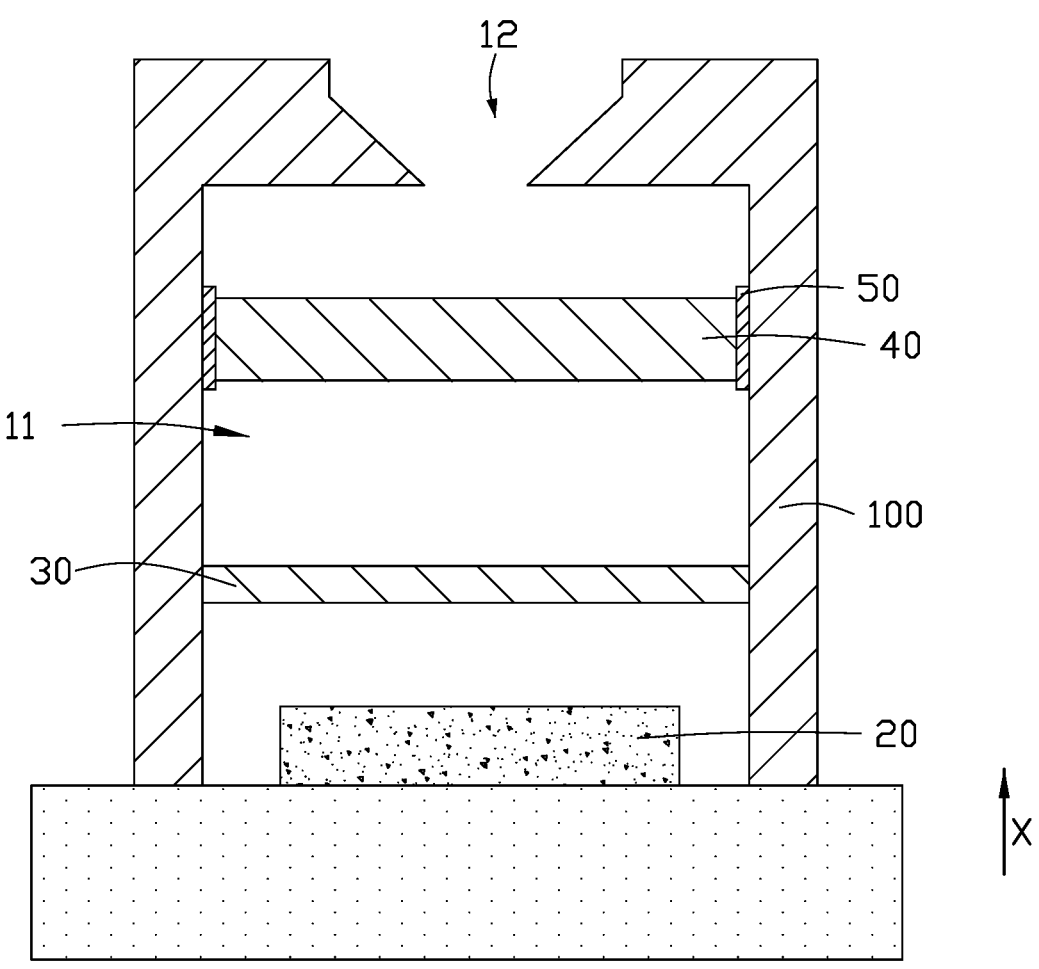
FIG. 1 is a diagrammatic view illustrating an imaging device according to an embodiment of the present disclosure.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to;" it specifically indicates open-ended inclusion or membership in the so-described combination, group, series, and the like.

Referring to FIG. 1, an embodiment of an imaging device 100 is provided, which includes a housing 10, a sensor 20, a filter 30, and a metalens 40. The housing 10 defines a receiving cavity 11 and a through hole 12 connected to the receiving cavity 11. The through hole 12 is used to face a target object and allows incoming light from the target object to pass through. The sensor 20 is disposed in the receiving cavity 11, and is coaxial with the through hole 12. The sensor 20 is used to receive far-infrared light of the incoming light from the target object and form an image according to the far-infrared light. In an embodiment, the far-infrared light is generated by the target object itself.

The filter 30 is disposed in the receiving cavity 11. A transmission direction of the far-infrared light from the target object to the sensor 20 is defined as a first direction (defined as 'X'). In the first direction X, the filter 30 is between the through hole 12 and the sensor 20. The filter 30 is used to allow the far-infrared light of the incoming light to pass through. The filter 30 is used to filter and eliminate light having a wavelength beyond a wavelength of far-infrared light, thereby facilitating the illumination of the far-infrared light onto the sensor 20 and obtaining a clear imaging.

Figure 2:
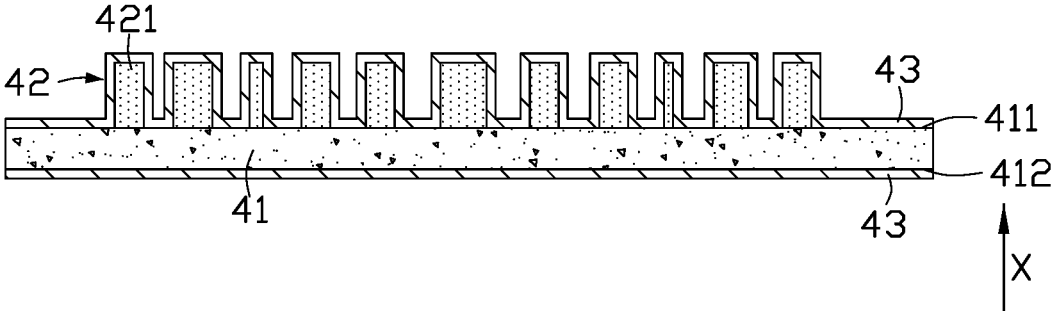
FIG. 2 is a diagrammatic view illustrating a metalens in the imaging device in FIG. 1.

Referring to FIGS. 1 and 2, the metalens 40 is disposed in the receiving cavity 11. The metalens 40 includes a substrate 41 and a metasurface structure 42. The substrate 41 is between the through hole 12 and the filter 30 in the first direction X. The metasurface structure 42 is connected to a side of the substrate 41 facing the through hole 12 or a side of the substrate 41 away from the through hole 12. In an embodiment, when the metasurface structure 42 is connected to the side of the substrate 41 facing the through hole 12, the far-infrared light passes through the metasurface structure 42 and the substrate 41 in sequence. In another embodiment, when the metasurface structure 42 is connected to the side of the substrate 41 away from the through hole 12, the far-infrared light passes through the substrate 41 and the metasurface structure 42 in sequence. The metasurface structure 42 includes a plurality of columnar units 421 arranged in an array. The columnar unit 421 extends in the first direction X. The metasurface structure 42 is used to refract the far-infrared light, thereby causing the far-infrared light to focus on the sensor 20 after passing through the filter 30.

The substrate 41 is made of a material which has a high transmittance for infrared light, so that the far-infrared light can pass through the substrate 41 with a high transmittance. In at least one embodiment, the substrate 41 is made of at least one of chalcogenide glass, zinc sulfide, zinc selenide, crystalline germanium, and crystalline silicon.

The columnar unit 421 is made of a material which has a high refractive index for infrared light. The metasurface structure 42 is used to change a travelling direction of the far-infrared light, so that the far-infrared light can focuses on the sensor 20 after passing through the filter 30 for clear imaging. In at least one embodiment, the metasurface structure 42 is made of crystalline silicon or crystalline germanium.

In an embodiment, a gap between two adjacent columnar units 421 can be filled with air or materials with high transmittance to infrared light.

In an embodiment, the metasurface structure 42 is manufactured by semiconductor processes including stepper lithography, step-by-step scanning lithography, nanoimprinting, laser direct writing, metal stripping, or ICP etching.

With the above configuration, the refracting and focusing of the infrared light can be achieved through a single metalens 40, thereby simplifying the structure of the imaging device 100. Compared with the existing optical lenses, the imaging device 100 has a simple structure, a small volume, and a light weight. During the assembling process of the imaging device 100, a tolerance issue generated between the optical lenses can be reduced, a production efficiency is improved, and a production cost is reduced.

In an embodiment, the metalens 40 satisfies the Binary 2 surface phase formula (Formula 1), the metalens 40 in the imaging device 100 is described:

$$\varphi = M \sum_{i=1}^{N} A_i \, \rho^{2i}, \qquad \text{(Formula 1)}$$

where φ is a phase; M is a diffraction order; N is a series of polynomial coefficients; and $A_i$ is a polynomial coefficient in a normalized radial aperture coordinate $\rho^{2i}$, and ρ is an element radius. Thereby, continuous transition of the phase can be introduced on the surface of the metalens 40, which can improve the refractive and focusing effects of the metalens 40.

In an embodiment, a value of '$A_i$' ranges from 5 to 30 to further improve the refractive and focusing effects of the metalens 40. Optionally, the value of $A_i$ is 5, 6, 7, 8, 9, 10, 11, 12, 13, 14, 15, 16, 17, 18, 19, 20, 21, 22, 23, 24, 25, 26, 27, 28, 29, 30, and any other value within the range of 5 to 30.

Referring to FIG. 2, in an embodiment, a height of the columnar unit 421 in the first direction X ranges from 3 μm to 15 μm. The height of the columnar unit 421 is at the level of the wavelength of the far-infrared light, thereby the refractive and focusing effects of the metalens 40 can be improved. Optionally, the height of the columnar unit 421 is 3 μm, 4 μm, 5 μm, 6 μm, 7 μm, 8 μm, 9 μm, 10 μm, 11 μm, 12 μm, 13 μm, 14 μm, 15 μm, and any other value within the range of 3 μm to 15 μm.

In an embodiment, the metalens 40 further includes an antireflective film 43, which is layered on a first surface 411 of the substrate 41 towards the through hole 12 and/or a second surface 412 of the substrate 41 away from the through hole 12. When the antireflective film 43 is layered on the first surface 411, the antireflective film 43 may further covers the columnar units 421. In an embodiment, the antireflective film 43 is layered on the first surface 411 and the second surface 412 of the substrate 41, and further covers the columnar units 421. The antireflective film 43 is used for increasing the transmittance of the far-infrared light passing through the metalens 40.

Figure 3:
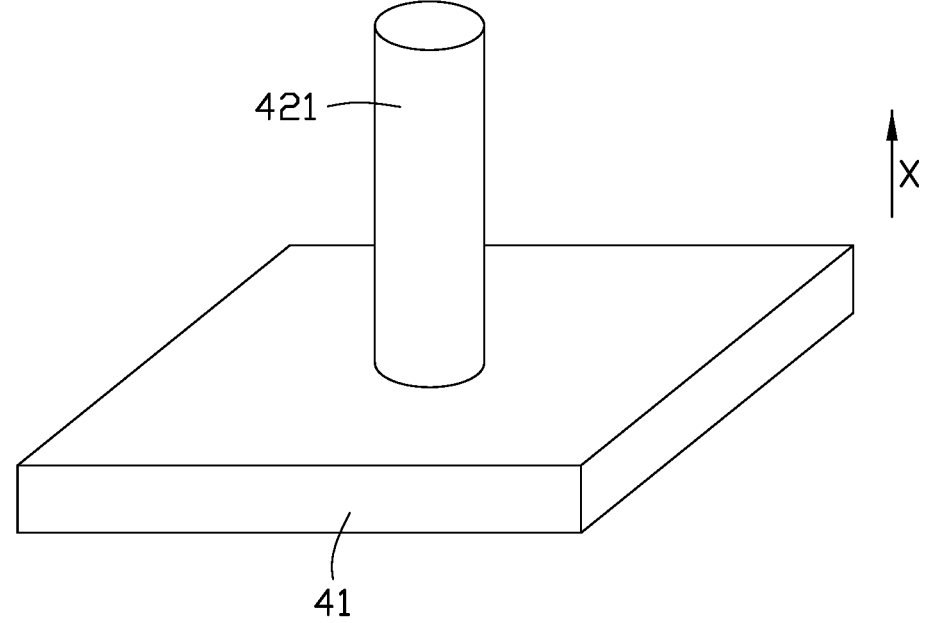
FIG. 3 is a diagrammatic view illustrating a columnar unit in the metalens in FIG. 2.

Referring to FIG. 3, in an embodiment, a cross-section in a second direction perpendicular to the first direction X of the columnar unit 421 is circular. A diameter of the circular cross-section ranges from 0.5 μm to 5 μm, thereby the diameter of the columnar unit 421 is at a sub wavelength level to improve the refractive and focusing effects of the metalens 40. Optionally, the diameter of the circle cross-section ranges is 0.5 μm, 1 μm, 1.5 μm, 2 μm, 2.5 μm, 3 μm, 3.5 μm, 4 μm, 4.5 μm, 5 μm, and any other value within the range of 0.5 μm to 5 μm.

In an embodiment, all columnar units 421 in the metasurface structure 42 have the same height to further enhance the refractive and focusing effects of the metalens 40.

Figure 4:
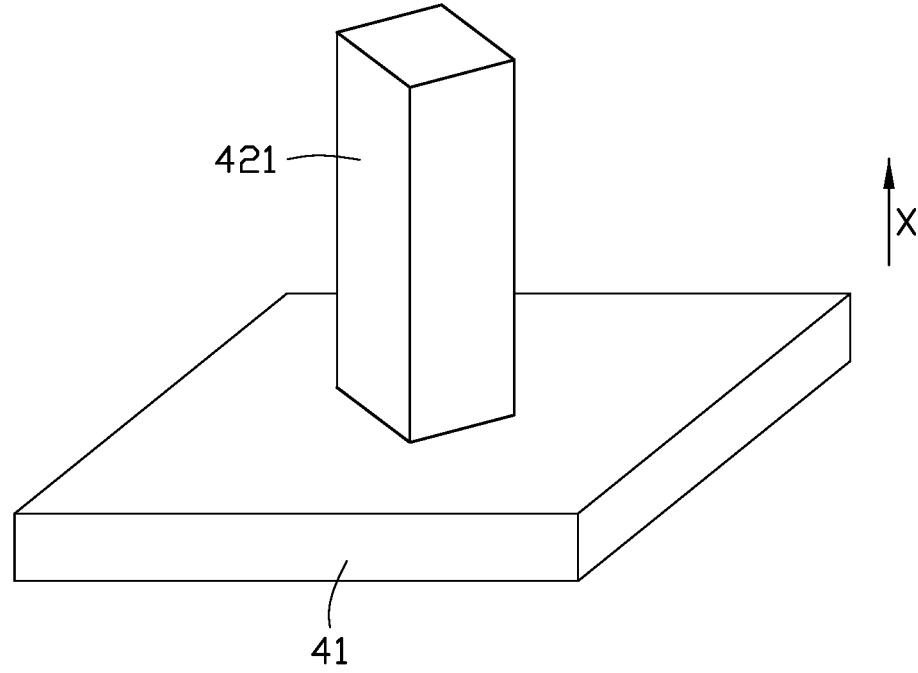
FIG. 4 is another diagrammatic view illustrating a columnar unit in the metalens in FIG. 2.

Referring to FIG. 4, in another embodiment, the cross-section in a second direction perpendicular to the first direction X of the columnar unit 421 is rectangular. A length of each of any two adjacent sides of the rectangle cross-section ranges from 0.5 μm to 5 μm to ensure the length and width of the columnar unit 421 are in the range of subwavelength, thereby improving the refractive and focusing effects of the metalens 40. Optionally, the length of each of any two adjacent sides of the rectangle cross-section is 0.5 μm, 1 μm, 1.5 μm, 2 μm, 2.5 μm, 3 μm, 3.5 μm, 4 μm, 4.5 μm, 5 μm, and any other value within the range of 0.5 μm to 5 μm.

The shape of the columnar unit 421 can also be elliptical cylindrical, hollow elliptical cylindrical, hollow rectangular cylindrical, hollow square cylindrical, and other structures.

The metalens 40 can be movably arranged between the through hole 12 and the filter 30 in the first direction X. In an embodiment, the columnar units 421 of the metalens 40 can be movably arranged between the through hole 12 and the filter 30 in the first direction X, in order to adjust a spacing between the metalens 40 and the sensor 20 to make the sensor 20 form a clear image.

In an embodiment, the multiple columnar units 421 on the substrate 41 can be arranged into an array of circular shape, fan-shaped shape, hexagonal shape, square shape, or other shape.

In an embodiment, referring to FIG. 1, an edge of the metalens 40 is fixed on a bearing seat 50. The bearing seat 50 is slidably connected to the housing 10. The bearing seat 50 is used to drive the metalens 40 to move in the first direction X. In an embodiment, the bearing seat 50 is connected to a driving component such as a motor or a cylinder. In another embodiment, the bearing seat 50 is connected to an electrostrictive element made of memory alloy. By inputting different amounts of current to the electrostrictive element, the electrostrictive element is stretched to drive the bearing seat 50 to move in the first direction X.

In an embodiment, the wavelength of the far infrared light ranges from 8 μm to 12 μm, and the imaging device 100 can form the image of the far infrared light from a human. The imaging device 100 is used in fingerprint recognition, unmanned driving, and temperature detection.

In an embodiment, the wavelength range of the far infrared light is 10 μm.

Figure 5:
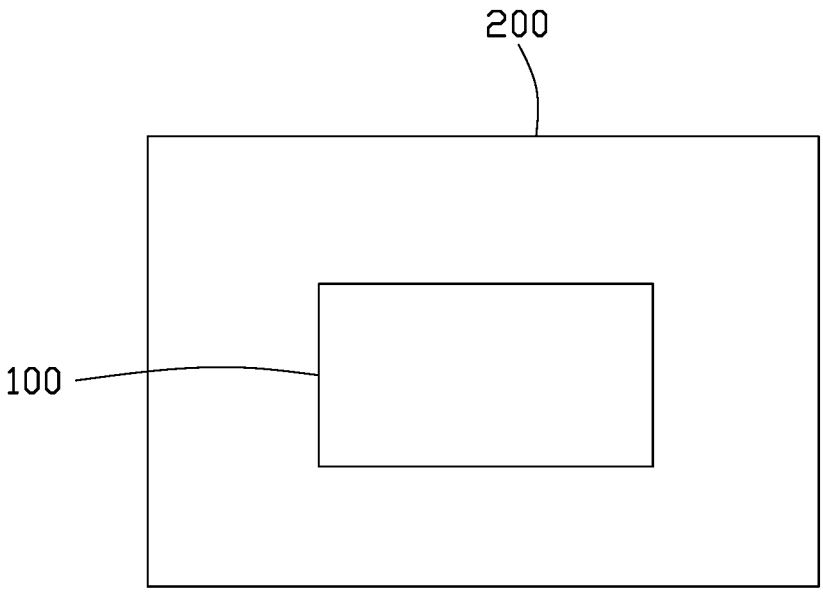
FIG. 5 is a diagrammatic view illustrating a fingerprint-recognition device according to an embodiment of the present disclosure.

Referring to FIG. 5, an embodiment of a fingerprint-recognition device 200 is further provided, which includes the imaging module 100. The fingerprint-recognition device 200 further includes an identification structure for receiving the infrared image of fingerprint generated by the imaging device 100 and recognizing the fingerprint in the image.

In summary, with the above configuration, the refracting and focusing of the infrared light can be achieved through a single metalens 40, thereby simplifying the structure of the imaging device 100 and the fingerprint-recognition device 200. Compared with the existing optical lenses, the imaging device 100 has a simple structure, a small volume, and a light weight. During the assembling process of the imaging device 100, a tolerance issue generated between the optical lenses can be reduced, a production efficiency is improved, and a production cost is reduced.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. An imaging device, comprising:
  a housing defining a receiving cavity and a through hole connected to the receiving cavity, the through hole configured to face a target object and allow incoming light from the target object to pass through;

a sensor disposed in the receiving cavity and configured to receive far-infrared light of the incoming light and form an image according to the far-infrared light;

a filter disposed in the receiving cavity, wherein the filter is located between the through hole and the sensor in a first direction, the first direction is defined as a transmission direction of the incoming light from the target object to the sensor, the filter is configured to allow the far-infrared light of the incoming light to pass through; and a metalens disposed in the receiving cavity, wherein the metalens comprises a substrate and a metasurface structure, the substrate is between the through hole and the filter in the first direction, the metasurface structure is connected to a surface of the substrate facing the through hole or away from the through hole, the metasurface structure comprises a plurality of columnar units arranged in an array, the metasurface structure is configured to refract the far-infrared light, thereby causing the far-infrared light to focus on the sensor after passing through the filter.

2. The imaging device of claim 1, wherein the metalens satisfies a Binary 2 plane phase formula as below:

$$\varphi = M \sum_{i=1}^{N} A_i \, \rho^{2i}, \qquad \text{(Formula 1)}$$

wherein φ is a phase, M is a diffraction order, N is a series of polynomial coefficients, $A_i$ is a polynomial coefficient in a normalized radial aperture coordinate $\rho^{2i}$, ρ is an element radius, and a value of $A_i$ ranges from 5 to 30.

3. The imaging device of claim 1, wherein a height of each of the plurality of columnar units in the first direction ranges from 3 μm to 15 μm.

4. The imaging device of claim 3, wherein a cross-section in a second direction perpendicular to the first direction of each of the plurality of columnar units is circular, and a diameter of the cross-section ranges from 0.5 μm to 5 μm.

5. The imaging device of claim 3, wherein a cross-section in a second direction perpendicular to the first direction of each of the plurality of columnar units is rectangular, and a length of each of any two adjacent sides of the cross-section ranges from 0.5 μm to 5 μm.

6. The imaging device of claim 1, wherein the metalens is movably disposed between the through hole and the filter in the first direction.

7. The imaging device of claim 6, wherein an edge of the metalens is fixed on a bearing seat, the bearing seat is slidably connected to the housing, the bearing seat is configured to drive the metalens to move in the first direction.

8. The imaging device of claim 1, wherein the substrate is made of at least one of chalcogenide glass, zinc sulfide, zinc selenide, crystalline germanium, and crystalline silicon.

9. The imaging device of claim 1, wherein the metasurface structure is made of crystalline silicon or crystalline germanium.

10. The imaging device of claim 1, wherein the metalens further comprises an antireflective film, the antireflective film is layered on the surface of the substrate facing the through hole and/or away from the through hole.

11. A fingerprint-recognition device, comprising:

an imaging device, comprising:

a housing defining a receiving cavity and a through hole connected to the receiving cavity, the through hole configured to face a target object and allow incoming light from the target object to pass through;

a sensor disposed in the receiving cavity and configured to receive far-infrared light of the incoming light and form an image according to the far-infrared light;

a filter disposed in the receiving cavity, wherein the filter is located between the through hole and the sensor in a first direction, the first direction is defined as a transmission direction of the incoming light from the target object to the sensor, the filter is configured to allow the far-infrared light of the incoming light to pass through; and a metalens disposed in the receiving cavity, wherein the metalens comprises a substrate and a metasurface structure, the substrate is between the through hole and the filter in the first direction, the metasurface structure is connected to a surface of the substrate facing the through hole or away from the through hole, the metasurface structure comprises a plurality of columnar units arranged in an array, the metasurface structure is configured to refract the far-infrared light, thereby causing the far-infrared light to focus on the sensor after passing through the filter.

12. The fingerprint-recognition device of claim 11, wherein the metalens satisfies a Binary 2 plane phase formula as below:

$$\varphi = M \sum_{i=1}^{N} A_i \, \rho^{2i}, \qquad \text{(Formula 1)}$$

wherein φ is a phase, M is a diffraction order, N is a series of polynomial coefficients, $A_i$ is a polynomial coefficient in a normalized radial aperture coordinate $\rho^{2i}$, ρ is an element radius, and a value of $A_i$ ranges from 5 to 30.

13. The fingerprint-recognition device of claim 11, wherein a height of each of the plurality of columnar units in the first direction ranges from 3 μm to 15 μm.

14. The fingerprint-recognition device of claim 13, wherein a cross-section in a second direction perpendicular to the first direction of each of the plurality of columnar units is circular, and a diameter of the cross-section ranges from 0.5 μm to 5 μm.

15. The fingerprint-recognition device of claim 13, wherein a cross-section in a second direction perpendicular to the first direction of each of the plurality of columnar units is rectangular, and a length of each of any two adjacent sides of the cross-section ranges from 0.5 μm to 5 μm.

16. The fingerprint-recognition device of claim 11, wherein the metalens is movably disposed between the through hole and the filter in the first direction.

17. The fingerprint-recognition device of claim 16, wherein an edge of the metalens is fixed on a bearing seat, the bearing seat is slidably connected to the housing, the bearing seat is configured to drive the metalens to move in the first direction.

18. The fingerprint-recognition device of claim 11, wherein the substrate is made of at least one of t chalcogenide glass, zinc sulfide, zinc selenide, crystalline germanium, and crystalline silicon.

19. The fingerprint-recognition device of claim 11, wherein the metasurface structure is made of crystalline silicon or crystalline germanium.

20. The fingerprint-recognition device of claim 11, wherein the metalens further comprises an antireflective film, the antireflective film is layered on the surface of the substrate facing the through hole and/or away from the through hole.

\* \* \* \* \*